(12) United States Patent
Downes (10) Patent No.: US 7,084,353 B1
(45) Date of Patent: Aug. 1, 2006

(54) TECHNIQUES FOR MOUNTING A CIRCUIT BOARD COMPONENT TO A CIRCUIT BOARD

(75) Inventor: Stuart D. Downes, Milford, MA (US)

(73) Assignee: EMC Corporation, Hopkinton, MA (US)

( * ) Notice: Subject to any disclaimer, the term of this patent is extended or adjusted under 35 U.S.C. 154(b) by 195 days.

(21) Appl. No.: 10/316,286

(22) Filed: Dec. 11, 2002

(51) Int. Cl.
*H01R 12/04* (2006.01)

(52) U.S. Cl. .................. 174/261; 174/255; 174/262

(58) Field of Classification Search ........ 174/260–266; 361/771–779
See application file for complete search history.

(56) References Cited

U.S. PATENT DOCUMENTS

| | | | | | |
|---|---|---|---|---|---|
| 4,134,339 | A | * | 1/1979 | Iten | 101/127 |
| 4,771,929 | A | | 9/1988 | Bahr et al. | 228/102 |
| 5,107,759 | A | | 4/1992 | Omori et al. | 101/114 |
| 5,308,928 | A | * | 5/1994 | Parla et al. | 174/261 |
| 5,484,963 | A | | 1/1996 | Washino | 174/261 |
| 5,593,080 | A | | 1/1997 | Teshima et al. | 228/39 |
| 5,683,788 | A | * | 11/1997 | Dugan et al. | 428/209 |
| 5,704,287 | A | | 1/1998 | Omori et al. | 101/127 |
| 5,729,439 | A | * | 3/1998 | Saito | 361/760 |
| 5,729,894 | A | * | 3/1998 | Rostoker et al. | 29/832 |
| 5,784,262 | A | * | 7/1998 | Sherman | 361/777 |
| 5,812,378 | A | | 9/1998 | Fjelstad et al. | 361/769 |
| 5,861,670 | A | | 1/1999 | Akasaki | 257/37 |
| 6,025,258 | A | | 2/2000 | Ochiai et al. | 438/613 |
| 6,090,301 | A | | 7/2000 | Mizukoshi et al. | 216/17 |
| 6,115,262 | A | * | 9/2000 | Brunner et al. | 361/774 |
| 6,131,511 | A | | 10/2000 | Wachi et al. | 101/129 |
| 6,135,024 | A | | 10/2000 | Higashida et al. | 101/123 |
| 6,150,827 | A | | 11/2000 | Pavoni et al. | 324/758 |
| 6,271,481 | B1 | * | 8/2001 | Goenka et al. | 174/261 |
| 6,316,736 | B1 | * | 11/2001 | Jairazbhoy et al. | 174/260 |
| 6,320,139 | B1 | * | 11/2001 | Byle et al. | 174/261 |
| 6,347,734 | B1 | | 2/2002 | Downes | 228/180 |
| 6,383,603 | B1 | * | 5/2002 | Nojioka | 428/132 |
| 6,386,435 | B1 | | 5/2002 | Downes | 228/248.1 |
| 6,388,890 | B1 | * | 5/2002 | Kwong et al. | 361/780 |
| 6,566,611 | B1 | * | 5/2003 | Kochanowski et al. | 174/261 |

\* cited by examiner

*Primary Examiner*—K. Cuneo
*Assistant Examiner*—Yuriy Semenenko
(74) *Attorney, Agent, or Firm*—BainwoodHuang (57) ABSTRACT

A circuit board has a layer of non-conductive material, and a set of soldering pads disposed on the layer of non-conductive material. The set of soldering pads defines a common axis that extends substantially through a midline of each soldering pad. Each soldering pad has, as measured perpendicularly through the common axis, an inner width, a first edge width and a second edge width. The inner width is longer than each of the first and second edge widths. Additionally, the first edge width is longer than the second edge width. Accordingly, the pads have less corner spaces that could otherwise, with melted solder, draw a circuit board component into an incorrect orientation which would result in incorrect mounting of the component. As a result, the component terminals tend to be drawn toward central regions of each pad for robust and reliable solder joint formation.

29 Claims, 6 Drawing Sheets

TECHNIQUES FOR MOUNTING A CIRCUIT BOARD COMPONENT TO A CIRCUIT BOARD

BACKGROUND OF THE INVENTION

A typical circuit board assembly includes a circuit board (i.e., layers of conductive and non-conductive material sandwiched together), and a variety of circuit board components which mount to the circuit board. Examples of circuit board components include, among other things, integrated circuits (ICs), individual circuit elements (e.g., resistors, capacitors, etc.), and connectors. Some components (e.g., lead frame packages, individual resistors, electrical connectors, etc) have leads which insert into and solder to sets of plated-through holes which extend through the circuit board. Other components (e.g., Ball Grid Array (BGA) packages, ceramic chips, etc.) solder to sets of surface mounting technology (SMT) pads or contacts disposed on the surface of the circuit board.

Some components include relatively large-sized packages such as BGA packages which, in some instances, can be approximately two inches by two inches (or more) in area. Contacts from such large-sized packages (e.g., solder balls) typically solder to square-shaped, round or octagon-shaped SMT pads. Examples of circuits which commonly reside in such large-sized packages include large scale integrated circuits such as microprocessor circuits, application specific integrated circuits (ASICs), and field programmable gate arrays (FPGAs).

In contrast, some components include relatively small-sized packages such as standard 0402, 0603 and 0805 ceramic chip packages which are set forth by the Electronics Industries Alliance (EIA). The contacts from such small-sized packages (e.g., the end terminals) typically solder to rectangle-shaped SMT pads disposed on the surfaces of the circuit boards. Examples of circuits which commonly reside in such small-sized packages include individual capacitor and diode circuits.

There are a variety of conventional approaches to soldering small-sized circuit board components to circuit boards. One conventional approach for soldering a small-sized circuit board component to SMT pads of a circuit board is called the "pre-glued approach". To illustrate the pre-glued approach, suppose that a circuit board manufacturer wishes to mount a diode contained in a standard 0603 package between two rectangle-shaped pads on a circuit board. First, the manufacturer places a drop of glue onto the surface of the circuit board between the two rectangle-shaped pads. Next, the manufacturer reads polarity ink markings printed on the surface of the circuit board (e.g., white ink printed over green FR4 material of the circuit board) to determine the proper orientation of the diode. Then, based on the ink markings, the manufacturer places the diode in contact with the drop of glue such that the anode of the diode sits over one rectangle-shaped pad and the cathode of the diode sits over the other rectangle-shaped pad. The manufacturer can repeat this step (e.g., in an automated manner using automated equipment) for other small-sized components.

After the glue has dried and now holds the diode in place, the manufacturer typically turns the circuit board over (i.e., upside down), and places other larger-sized circuit board components into their corresponding soldering positions on the circuit board and passes the circuit board structure through a wave soldering system. As components pass over the solder wave, solder from the solder wave wets to the contacts of both the components and the circuit board to solder the components to the circuit board. In particular, solder from the solder wave flows between the terminals of the diode package and the two rectangular-shaped pads to solder the diode package to the circuit board. During the wave soldering process, the drop of glue continues to hold the diode package in place thus preventing the package from inadvertently moving out of its earlier-placed position.

Another conventional approach to soldering a small-sized circuit board component to a circuit board is called the "printed paste approach". To illustrate the printed paste approach, suppose that a circuit board manufacture wishes (i) to initially solder a diode having a small-sized circuit board component package (along with perhaps other similar-sized components) to a first side of the circuit board during a first heating process, and (ii) to subsequently solder larger-sized circuit board components to a second side of the circuit board structure during a second heating process. To this end, the manufacturer typically prints solder paste over two rectangle-shaped SMT pads on the first side of the circuit board structure, identifies the proper orientation of the diode based on polarity ink markings printed on the first side, and places the anode and the cathode of the diode in contact with the printed paste and over the appropriate rectangle-shaped SMT pads based on the printed polarity ink markings. The manufacturer may repeat this step for other similar-sized components that it wishes to mount to the first side. The manufacturer then passes the circuit board through an oven in order to activate flux and melt solder within the printed solder paste and thus solder the diode terminals to the two rectangle-shaped SMT pads (as well as perhaps solder other components to other pads).

After the circuit board has cooled to form solder joints between each component and the first side of the circuit board, the manufacturer flips the circuit board over, prints solder paste on the second side of the circuit board, places additional components in contact with the printed paste over their corresponding mounting locations (e.g., large-sized components), and passes the circuit board through the oven a second time to solder the additional components to the second side of the circuit board. During this second heating phase, the solder joints on the first side of the circuit board tend to re-flow but surface tension provided by the solder, which is wetted to both the rectangle-shaped soldering pads and the component terminals, tends to prevent the earlier-soldered components (e.g., the diode) from falling off the first surface of the circuit board. Accordingly, when the circuit board finally cools, mounted components reside on both sides of the circuit board.

SUMMARY OF THE INVENTION

Unfortunately, there are deficiencies to the above-described conventional approaches to soldering small-sized circuit board components to circuit boards. For example, in the above-described conventional pre-glued approach, the glued small-sized components can be placed in crooked positions relative to the rectangle-shaped SMT pads prior to soldering. As a result, during the wave soldering process, the glue holds the components out of their proper places such that reliable solder joints do not form between the component terminals and the SMT pads (e.g., solder gaps form rather than solder joints).

Additionally, in the above-described conventional printed paste approach, the initially soldered small-sized components can be placed in miss-oriented positions due to their small feature size. In some situations, the small-sized component can shift out of their proper positions during the second soldering process, i.e., when the solder joints between the component terminals and the rectangle-shaped SMT pads re-flows, out-reaching areas of the pads can draw liquefied solder and component contacts out of their proper soldering positions. For example, the drawing forces from liquefied solder on one pad may be greater than that from another (e.g., if the solder joint at one pad re-flows before the other due to differences in proximity to other thermal mass circuit board components and structures) causing the component to pull toward one pad and away from the other. In some situations, the pulling force can be so great that a component terminal moves completely away from a pad resulting in an open circuit (i.e., an electrical discontinuity) between that terminal and the pad. In extreme cases, a component terminal arches up and away from the circuit board surface leaving the component package soldered to only one pad and extending in a substantially orthogonal manner from the circuit board. Such extreme cases are commonly referred to as "tombstoning" by those of skill in the art since the improperly mounted component resembles a tombstone.

Furthermore, in both the pre-glued approach and the printed paste approach, the rectangular-shaped SMT pads (e.g., roughly 50 to 60 mils in width and length) to which the component contacts mount are often very large and require a substantial amount of circuit board surface "real estate". As a result, it can be difficult to find convenient locations for these pads. Moreover, once such pad locations have been determined, the large size of these pads can hinder the placement of other circuit board structures (e.g., other components, plated-through holes, traces, etc.).

Also, in both the pre-glued approach and printed paste approach, the manufacturer typically must read polarity ink markings printed on the circuit board surface to determine the proper orientation of certain types of components such as a diode which has an anode terminal and a cathode terminal. If the manufacturer incorrectly reads the polarity ink markings (e.g., because the markings are poorly printed, inconsistent, confusing, partially rubbed off, etc.), the manufacturer will incorrectly mount the component resulting in an improperly manufactured circuit board. Accordingly, the manufacturing yield will drop, and the manufacturer will be force to either scrap or rework the improperly manufactured circuit boards.

Embodiments of the invention are directed to techniques for mounting a circuit board component to a circuit board using generally trapezoid-shaped pads, i.e., pads having shapes resulting from a combination of side-by-side trapezoids. The use of such pads (i) enables reliable mounting of circuit board components using a conventional soldering process such as printed paste soldering, as well as (ii) inhibits improper movement of the circuit board component if solder joints holding the component to the pads re-flow. Accordingly, the use of such techniques are well-suited for circuit board manufacturing processes which involve multiple heating phases (e.g., multiple passes through an oven resulting in re-melting of earlier-formed solder joints). Additionally, the use of such pads alleviate the need for alternative soldering solutions such as the use of high-temperature solder in an initial higher-temperature soldering process which could damage components due to higher temperature stresses. The techniques of the invention tend to raise circuit board manufacturing yields (e.g., more manufactured circuit boards without failure) as well as tend to lower manufacturing costs (e.g., less waste and less required rework).

One embodiment of the invention is directed to a circuit board having a layer of non-conductive material, and a set of soldering pads disposed on the layer of non-conductive material. The set of soldering pads defines a common axis that extends substantially through a midline of each soldering pad. Each soldering pad has, as measured perpendicularly through the common axis, an inner width, a first edge width and a second edge width. The inner width is longer than each of the first and second edge widths. Additionally, the first edge width is longer than the second edge width. Accordingly, each pad can have a general trapezoidal shape which tends to draw a corresponding component terminal toward a central region of that pad for robust and reliable solder joint formation. In contrast to larger conventional rectangle-shaped pads, this embodiment has less outer-reaching corner spaces that could otherwise, in combination with melted solder, draw a circuit board component into an incorrect orientation resulting in incorrect mounting of the component (e.g., the reduced pad size provides a smaller crown area). Furthermore, there is no need to pre-glue the component which would otherwise run the risk of improperly orienting the component during the gluing process.

In one arrangement, each soldering pad substantially defines a two-dimensional shape having six sides. Additionally, each intersection between two of the sides has an angle which is greater than 90 degrees. Accordingly, there are no sharp corner spaces that could draw a component terminal away from a central region of a pad, thus leaving the component terminals centered on the pads.

In one arrangement, the set of soldering pads includes a surface mount pad which is configured for copper-defined soldering and a second soldering pad. The surface mount pad has three sides which are distal from the second soldering pad and three other sides which are proximate the second soldering pad. A surface trace physically connects to one of the three sides which are distal from the second soldering pad at a substantially orthogonal angle. Additionally, the circuit board further includes a keep-out region adjacent the other three sides which are proximate the second soldering pad, the keep-out region being free off any surface trace. Accordingly, the arrangement can accommodate a surface trace, and there is little or no drawing force provided by that surface trace which could adversely affect the positioning of the component when the solder is in liquid form.

In one arrangement, the set of soldering pads includes a first surface mount pad which is configured for copper-defined soldering and a second surface mount pad which is configured for mask-defined soldering. For example, the metallic material of the second surface mount pad can have a substantially rectangular or square shape, but the exposed surface of the pad can have a trapezoidal shape (e.g., a trapezoid shaped surface exposed by a transparent solder mask). This arrangement enables a circuit board manufacturer to easily distinguish the two pads visually, as well as standardize which pad is intended to connect to the anode of a diode component, and which pad is intended to connect to the cathode of the diode component. Accordingly, the manufacturer is not dependent on reading printed polarity ink markings which are often inconsistent, and difficult to read. Rather, with this arrangement of the invention, such a configuration (e.g., anodes always mount to the copper-defined pad) can be made into an industry-wide or company-wide standard thus permanently removing the possibility of confusion in the future.

In one arrangement, the circuit board further includes a plated-through hole which extends through the layer of non-conductive material and physically connects with the second surface mount pad which is configured for mask-defined soldering. Again, if the first surface mount pad is prohibited from having a plated-through hole, but instead has a surface trace, this arrangement enables a circuit board manufacturer to easily distinguish the two pads visually. That is, the manufacturer can standardize which pad is intended to connect to the anode of a diode component, and which pad is intended to connect to the cathode of the diode component. As a result, the manufacturer does not need to rely of reading printed polarity ink marks which can be confusing and which can rub off. Thus, with this arrangement, such a configuration (e.g., anodes always mount to the copper-defined pad) can be made into an industry-wide or company-wide standard thus permanently removing the possibility of confusion in the future.

The features of the invention, as described above, may be employed in circuit board manufacturing systems, circuit board assemblies and manufacturing methods such as those of EMC Corporation of Hopkinton, Mass.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for mounting a circuit board component to a circuit board using generally trapezoid-shaped pads. The use of such pads (i) enables reliable mounting of circuit board components using a conventional soldering process such as printed paste soldering, as well as (ii) inhibits improper movement of the circuit board component if solder joints holding the component to the pads re-flow. Accordingly, the use of such techniques are well-suited for circuit board manufacturing processes which involve multiple heating phases (e.g., multiple passes through an oven resulting in re-melting of earlier-formed solder joints). Additionally, the use of such pads alleviates the need for alternative soldering solutions such as the use of high-temperature solder in an initial higher-temperature soldering process which could damage components due to higher temperature stresses. The techniques of the invention tend to raise circuit board manufacturing yields (e.g., more manufactured circuit boards without failure) as well as tend to lower manufacturing costs (e.g., less waste and less required rework).

Figure 1:
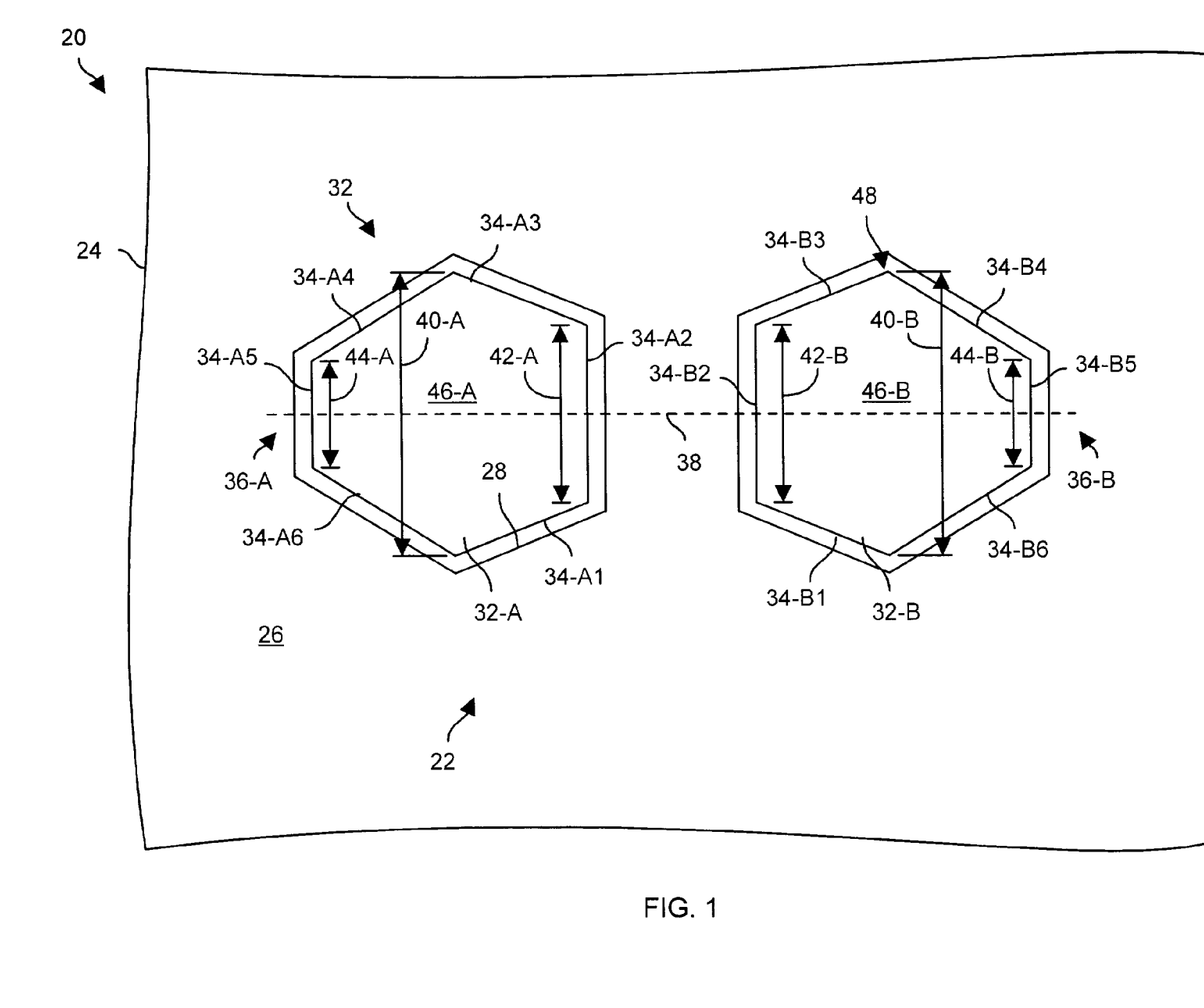
FIG. 1 is a top view of a set of pads disposed on a circuit board which is suitable for use by the invention.

FIG. 1 shows a top view 20 of a component mounting location (or footprint) 22 on a portion of a circuit board 24 which is suitable for use by the invention. The mounting location 22 is configured to solder to a component package having a pair of contacts (e.g., a standard 0402, 0603, 0805 package containing a diode, capacitor, resistor, etc.).

The circuit board 24 is a rigid structure of conductive layers (e.g., copper) and non-conductive layers (e.g., FR4 fiberglass) sandwiched together. In FIG. 1, the electrical connections (e.g., a surface trace, a via that connects to a buried trace, etc.) to circuit board contacts are omitted for simplicity. Accordingly, in addition to contacts of the mounting location 22, only a non-conductive surface layer 26 of the circuit board 24, and a substantially transparent mask layer 28 are visible in the top view 20.

By way of example only, the mounting location 22 includes a set of trapezoid-shaped SMT pads 32-A, 32-B, i.e., the shape of each pad 32-A, 32-B results from a combination of side-by-side trapezoids (e.g., two). In particular, the pad 32-A has six substantially straight sides 34-A1, 34-A2, 34-A3, 34-A4, 34-A5 and 34-A6 which, by their length and position, define a midline 36-A of the pad 32-A (i.e., the pad 32-A is symmetrical about the midline 36-A). Similarly, the pad 32-B has six substantially straight sides 34-B1, 34-B2, 34-B3, 34-B4, 34-B5 and 34-B6 which define a midline 36-B of the pad 32-B. In turn, the combination of the midlines 32-A, 32-B define a common axis 38 of the set of pads 32-A, 32-B. In one arrangement, and as shown in FIG. 1, the common axis 38 bisects the mounting location 22 and the pads 32-A, 32-B. As will be explained later, when a circuit board component properly mounts to the pads 32-A, 32-B, the component orients substantially along the common axis 38 (i.e., a central axis of the component orients substantially parallel to the common axis 38).

As shown in FIG. 1, each pad 32-A, 32-B has a variety of dimensions as measured perpendicularly from the common axis 38. In particular, each pad 32-A, 32-B (collectively, pads 32) has an inner width 40-A, 40-B (collectively, inner widths 40), a first edge width 42-A, 42-B (collectively, first edges 42), and a second edge width 44-A, 44-B (collectively, second edges 44). The inner widths 40-A, 40-B are measured through central regions 46-A, 46-B of the pads 32-A, 32-B. In contrast, the first edge widths 42 are measured along the peripheral sides 34 of the pads 32 which are closest to each other, i.e., the first edge widths 42-A, 42-B run through the sides 34-A2, 34-B2 (see FIG. 1). Additionally, the second edge widths 44 are measured along the peripheral sides 34 of the pads 32 which are furthest from each other, i.e., the second edge widths 44-A, 44-B run along the peripheral sides 34-A5, 34-B5 (FIG. 1).

It should be understood that the each intersection 48 between two straight sides 34 is at an angle which is greater than 90 degrees. Accordingly, there are no sharp corners on the pads 32 which could create outer-reaching spaces that could draw a component terminal into an improper orientation during the soldering process.

Additionally, it should be understood that the intersections 48 of the sides 34 tend to be rounded due to the increase in exposed surface area (relative to a straight edge) during the etching process. The wide angles between intersecting sides 34 and rounded corners 48 promotes good solder distribution over the pad surfaces, i.e., distribution of a proper and even amount of solder over the pad surfaces. Moreover, the stencils which are used to print the solder paste can have apertures which match the geometry of the pads 32. Since the angles of the intersecting sides 34 are greater than 90 degrees and rounded, the angles within the apertures of the stencil are also greater than 90 degrees and rounded thus facilitating solder paste removal from the apertures and reducing the likelihood of aperture clogging (i.e., preventing old solder paste from clogging the apertures).

In one arrangement, the pads 32 are significantly smaller than conventional rectangle-shaped SMT pads. For example, a conventional rectangle-shaped SMT pad for a standard 0603 package is typically around 60 mils length. In contrast to such conventional SMT pads and in accordance with an arrangement of the invention, the pad inner widths 40 are substantially 40 mils (e.g., +/− a margin of error such as 5%), the pad first edge widths 42 are substantially 25 mils, and the pad second edge widths are substantially 16 mils. Additionally, the length of the pad is substantially 40 mils (e.g., 20 mils to from the side 34-A5 to the midpoint of the pad 32-A, and another 20 mils from the midpoint to the opposite side 34-A2 of the pad 32-A). As a result, the pads 32 do not have significant outer-reaching peripheral spaces (e.g., outer-reaching side spaces and corner spaces) as in the conventional rectangle-shaped SMT pads. Accordingly, if a circuit board manufacturer attempts to mount a circuit board component to the mounting location 22 (FIG. 1) using a printed solder paste soldering process, i.e., a soldering process in which the component is free to move in response to drawing forces (e.g., solder surface tension), the component terminals are drawn toward central regions 46-A, 46-B of the pads 32-A, 32-B. The drawing forces tend to be smaller and more focused about the central regions 46-A, 46-B compared to the drawing forces of conventional larger-sized SMT pads. Thus, with the invention, it is unlikely that the component terminals will be drawn into an improper orientation (e.g., unlikely drawn to a pad periphery space and out of alignment with the common axis 38, unlikely drawn into a tombstoning position, etc.). Further details of the invention will now be provided with reference to FIG. 2.

Figure 2:
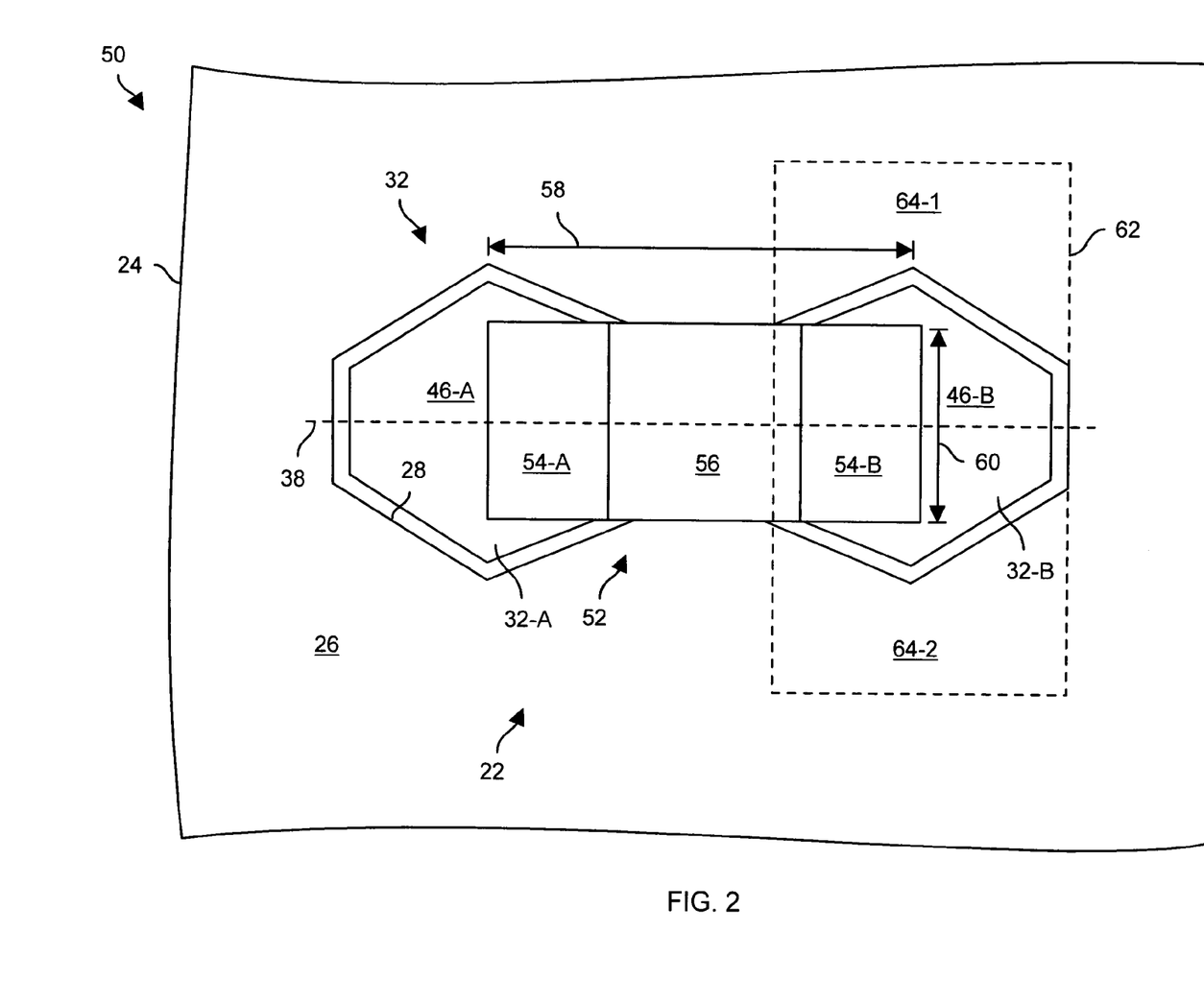
FIG. 2 is a top view of the set of pads of FIG. 1 with a circuit board component placed thereon.

FIG. 2 shows a top view 50 of the component mounting location 22 on the portion of the circuit board 24 when a component 52 properly aligns with the common axis 38 defined by the pads 32. As shown in FIG. 2, the component 52 has terminals 54-A, 54-B which correspond to the pads 32-A, 32-B, and a central portion 56. The component 52 has a length 58 and a width 60, and placement of the widest part of the pads 32-A, 32-B intentionally coincides substantially with length 58. Similarly, the inner widths 40-A, 40-B (see FIG. 1) intentionally extend beyond the width 60, but not so far as to promote substantial shifting or rotation of the component 52 (e.g., clockwise or counterclockwise rotation of the component 52 about its central portion 56).

It should be understood that, in contrast to conventional larger rectangle-shaped pads which have outer-reaching spaces (e.g., see dashed lines 62 illustrating such a pad, and its outer-reaching spaces 64-1, 64-2), the pads 32 of the mounting location 22 do not need to have such spaces. Accordingly, any drawing forces from the pads 32 tends to substantially draw the component terminals 54 toward the central regions 46 of the pads 32 in a self-centering manner. In particular, each pad 32 provides a sufficient amount of pad area to properly draw and maintain placement of solder and a corresponding component terminal 54, as well as to accommodate size variations due to tolerance differences from one component package to another. However, each pad 32 does not have an exceedingly large surface area that could draw the component 52 from a proper orientation, e.g., there is less pad material for each pad 32 compared to conventional pads resulting in reduced likelihood of component rotation or tombstoning.

It should be understood that the ink markings 30-A, 30-B are disposed on the circuit board 24 to outline the center region 56 of the component 52 when the component 52 is properly oriented over the mounting location 22. Such markings 30-A, 30-B provide an easy visual check for the circuit board manufacturer when confirming proper installation of the circuit board component 52. Further details of the invention will now be provided with reference to FIG. 3.

Figure 3:
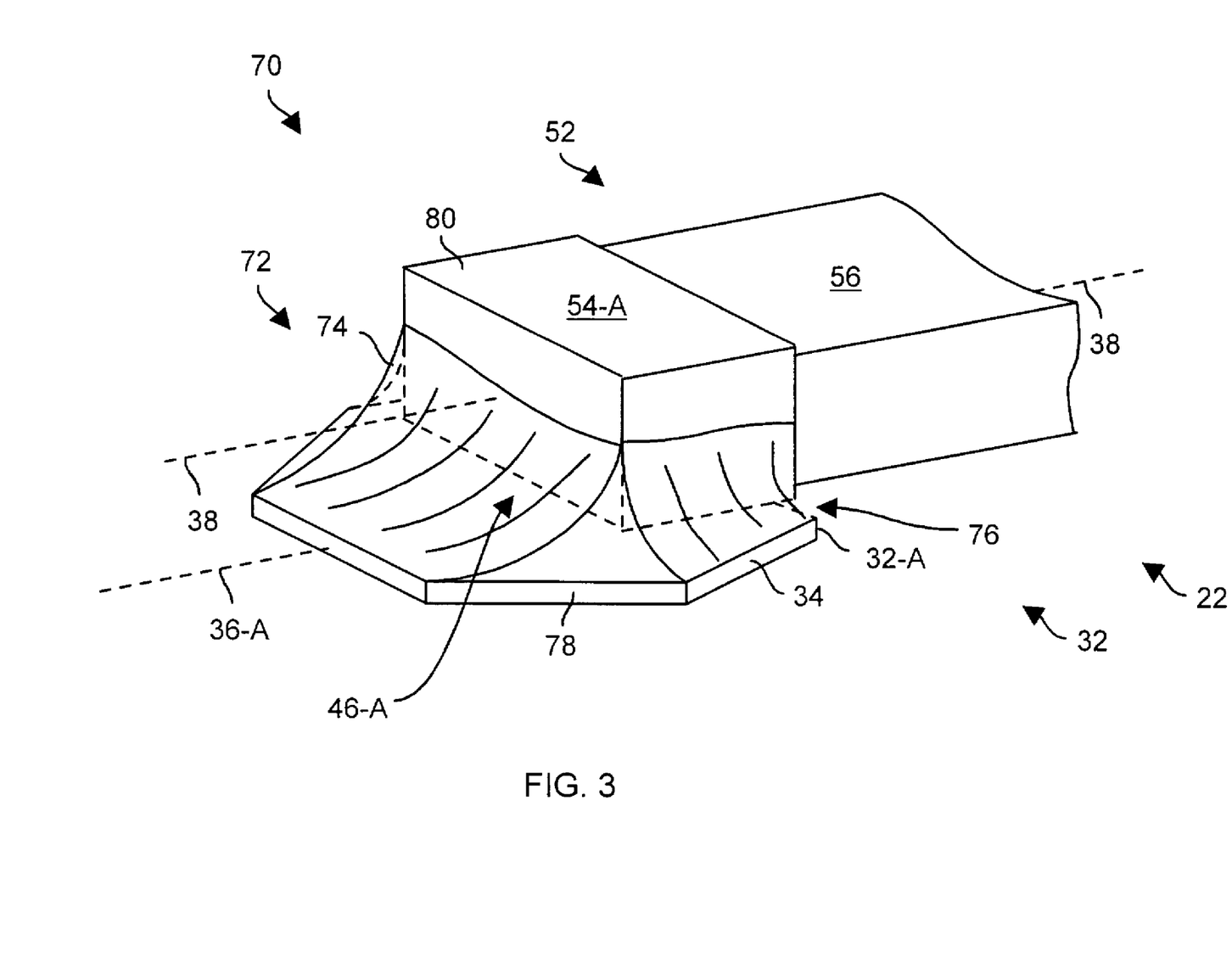
FIG. 3 is a perspective view of a circuit board contact of the circuit board component of FIG. 2.

FIG. 3 is a perspective view 70 of the pad 32-A when healthily soldered to the terminal 54-A of the component 52. As shown, the midline 36-A of the pad 32-A participates in definition of the common axis 38 of the mounting location 22, and the component 52 extends along the common axis 38.

A solder joint 72 provides robust and reliable connectivity between the terminal 54-A and the pad 32-A. In particular, the solder joint 72 includes fillets 74 which substantially surround the terminal 54-A and contact the pad 34-A. In one arrangement, some solder wets to all of the exposed metallic locations including the space 76 under the terminal 54-A, i.e., the metallic surfaces between the terminal 54-A and the pad 32-A, as well as the pad edges 78 and the top regions 80 of the terminal 54-A. Accordingly, the solder joint 72 is characterized by a good end fillet and lap joint.

In one arrangement, prior to soldering the component 52 to the mounting location 22, the circuit board manufacturer applies enough solder paste such that, when the flux within the solder paste activates and the solder within the solder paste wets to the metallic surfaces, the volume of solder is substantially the amount which forms triangles between the remaining exposed pad surfaces and half of the component terminal height (i.e., substantially halfway up the sides of the component terminal), as illustrated in FIG. 3.

It should be understood that the solder joint 72 can re-flow if the circuit board 24 is exposed to a subsequent heating process (e.g., if the circuit board is flipped over so that additional components can be soldered to the other side). In such situations, the solder within the solder joint 72 becomes re-liquified. However, due to the trapezoidal shape of the pads 32, the terminals 54 are no drawn away from their proper positions on the pads 32. Rather, since there is a lack of out-reaching pad space, the drawing forces (e.g., solder surface tension) tends to draw the terminals 54 toward the central regions 46 of the pads 32 (see the central region 46-A of pad 32-A in FIG. 3). Accordingly, the geometry of the pads 32 promotes self-centering movement of the component terminals 52. Further details of the invention will now be provided with reference to FIG. 4.

Figure 4:
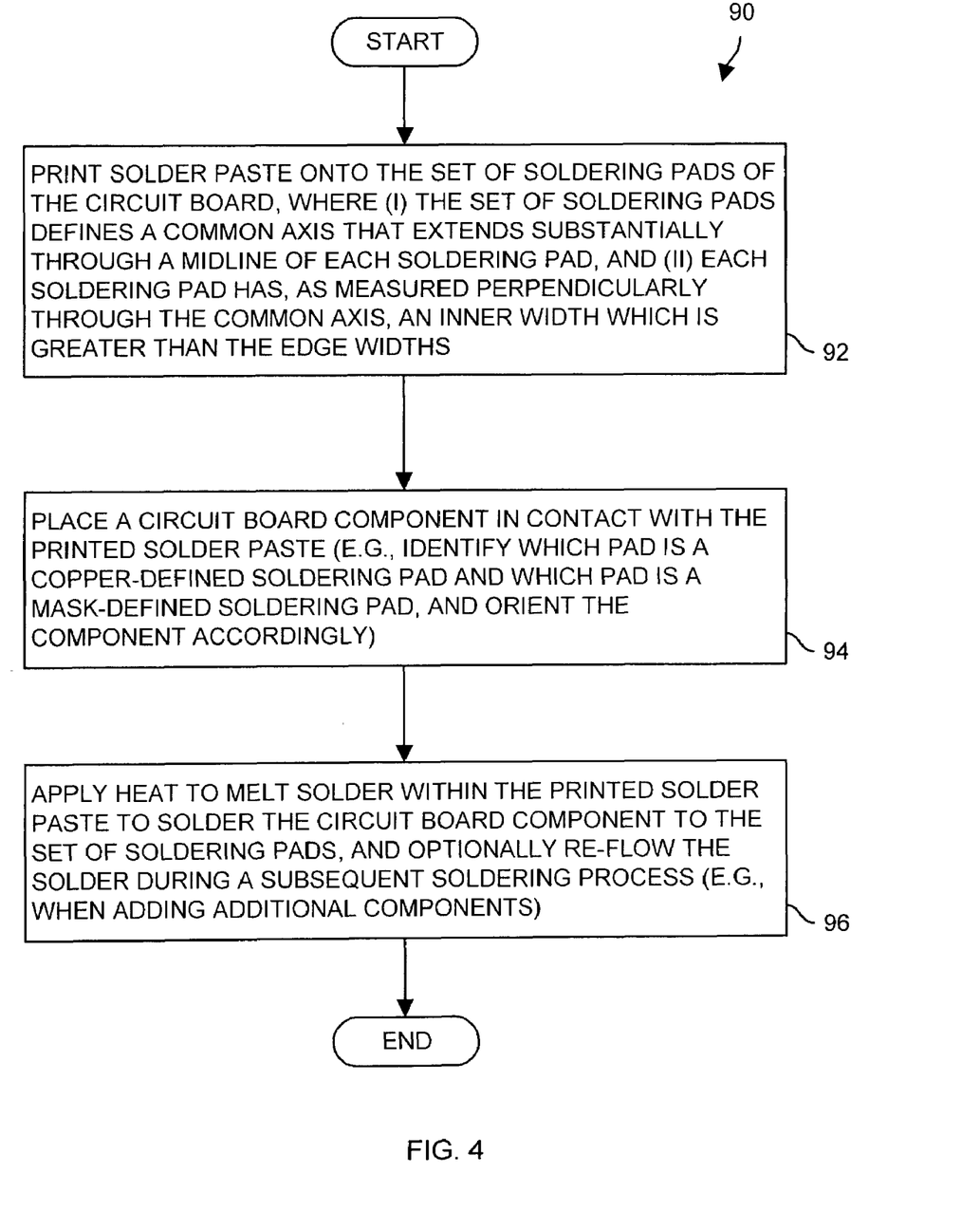
FIG. 4 is a flowchart of a procedure which is performed by a circuit board manufacturer when mounting the circuit board component to the set of pads of FIG. 1.

FIG. 4 is a flowchart of a procedure 90 which is performed by a circuit board manufacturer when mounting the circuit board component 52 to the set of pads 32 of FIG. 1. The resulting circuit board assembly tends to include a robust set of solder joints which both mechanically and electrically connect the component 52 to the circuit board 24 (also see FIG. 2).

In step 92, the manufacturer prints printing solder paste onto the set of soldering pads 34 of the circuit board 24. Recall that the set of soldering pads 32 defines a common axis 38 that extends substantially through a midline 34 of each soldering pad 32. Additionally, each soldering pad 34 is generally trapezoid shaped. That is, as measured perpendicularly through the common axis 38, an inner width 40, a first edge width 42 and a second edge width 44, where the inner width 40 is longer than each of the first and second edge widths 42, 44, and where the first edge width 42 is longer than the second edge width 44 (also see FIG. 1).

In step 94, the manufacturer prints solder paste over the pads 34 and places the circuit board component 52 in contact with the printed solder paste. In one arrangement, the solder paste include (i) flux which cleans oxidized material from the metallic surfaces of the component terminals 54 and the pads 34, and (ii) solder (e.g., tin-lead solder).

In step 96, the manufacturer applies heat to melt the solder within the printed solder paste to solder the circuit board component 52 to the set of soldering pads 34 thus forming the circuit board assembly. For example, in one arrangement, the manufacturer passes the circuit board through a specialized oven. When the circuit board assembly cools off, the solder hardens to form reliable solder joints between the pads 34 and the terminals 54. The component 52 tends to remain properly oriented due to the absence of over-reaching pad spaces which could otherwise draw the component 52 into an improper orientation as is common with conventional larger, rectangular pads.

It should be understood that the circuit board assembly is well-suited for one or more subsequent soldering processes. For example, suppose that the manufacturer now wishes to solder additional components to the other side of the circuit board 24. To this end, the manufacturer can simply flip the circuit board assembly over and print additional solder paste over other mounting locations. The manufacturer can then place the additional components in contact with the newly printed solder paste, and re-apply heat (e.g., pass the circuit board assembly through the oven a second time) to mount the new components. When the heat is re-applied, the initially formed solder joints can re-flow. However, it is unlikely that the component 52 will shift its position due to the drawing forces focusing the terminals 54 to the central regions 46 of the pads 34. Rather, the self-centering nature of the pad geometries tends to correct any abnormalities in the earlier-formed solder joints (e.g., a fracture due to accidental mis-handling of the circuit board assembly shortly after initial solder joint formation) and form reliable new solder joints. Further details of the invention will now be provided with reference to FIG. 5.

Figure 5:
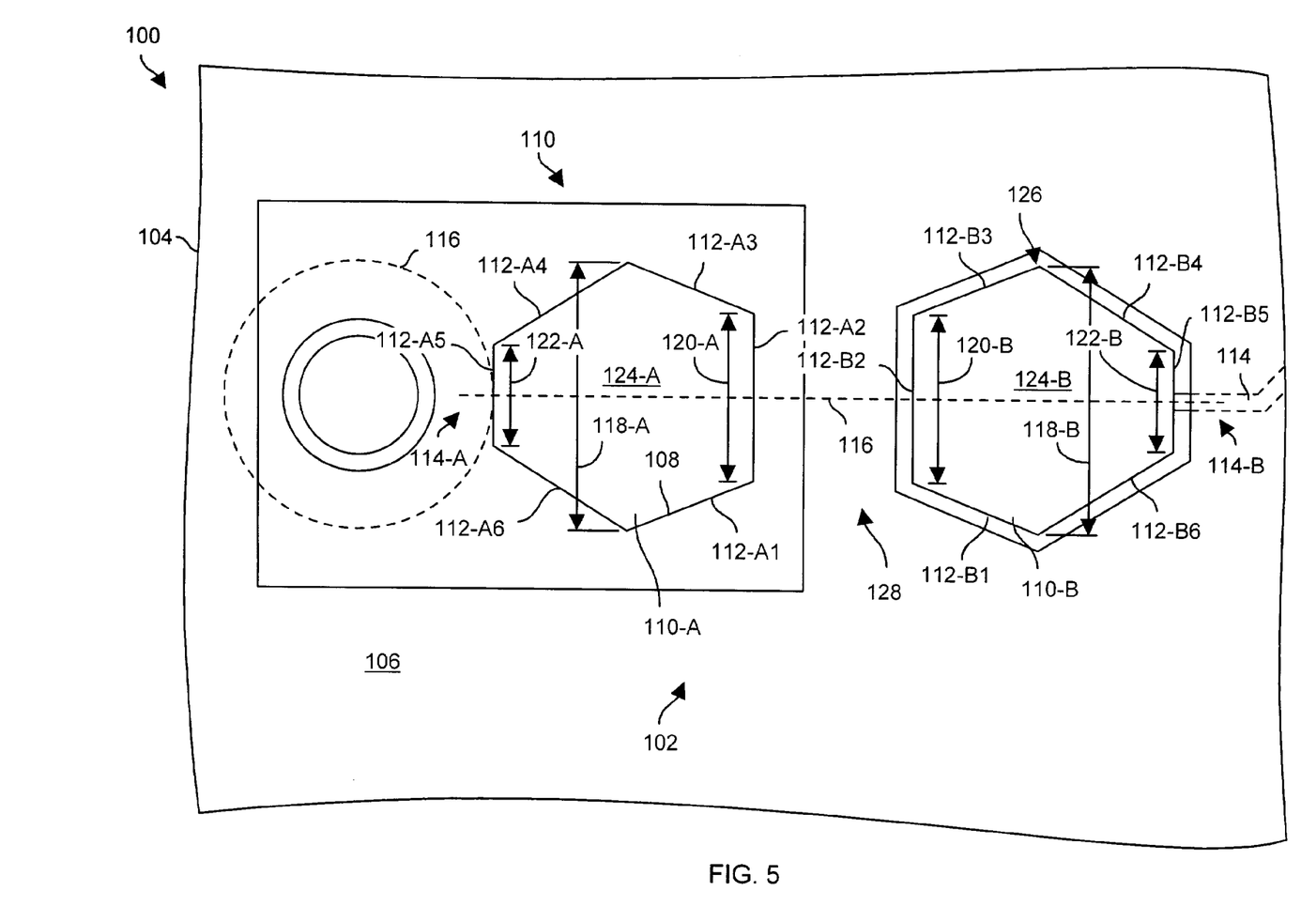
FIG. 5 is a top view of an alternative set of pads on a circuit board which is suitable for use by the invention.

FIG. 5 is a top view 100 of an alternative component mounting location 102 on a portion of a circuit board 104 which is suitable for use by the invention. In a manner similar to that for the component mounting location 22 of FIG. 1, the mounting location 102 is well-suited for soldering to a component package having a pair of contacts (e.g., a standard 0402, 0603, 0805 package containing a diode, capacitor, resistor, etc.).

The circuit board 104 is a rigid structure of conductive layers (e.g., copper) and non-conductive layers (e.g., FR4 fiberglass) sandwiched together. The circuit board 104 includes a surface layer 106 and a transparent mask layer 108. Additionally, the circuit board 104 includes a set of trapezoid-shaped SMT pads 110-A, 110-B (collectively, pads 110), and electrical connections 112 to those pads 110. The electrical connections include a surface trace 114 which connects with the pad 110-B, and a plated-through hold 116 which connects with the pad 110-A. Although ink guide or alignment markings are omitted from the top view 100 for simplicity, it should be understood that such markings can be included on the circuit board 104 for visual inspection purposes (e.g., alignment markings can be placed to delineate the outer sides of the component packages to enable verification of proper component placement).

As in the mounting location 22 of FIG. 1, each pad 110 of the mounting location 102 of FIG. 5 is substantially trapezoid-shaped. That is, the shape of each pad 110-A, 110-B is a combination of side-by-side trapezoids. As a result, each pad 110 has six straight sides 112. In particular, the pad 110-A has sides 112-A1, 112-A2, 112-A3, 112-A4, 112-A5 and 112-A6 which define a midline 114-A of the pad 110-A. Similarly, the pad 110-B has six substantially straight sides 112-B1, 112-B2, 112-B3, 112-B4, 112-B5 and 112-B6 which define a midline 114-B of the pad 110-B. In turn, the combination of the midlines 114-A, 114-B define a common axis 116 of the set of pads 110-A, 110-B. As shown in FIG. 5, the common axis 116 bisects the mounting location 102 and the pads 110-A, 110-B. As explained above in connection with the pads 32 of the mounting location 22, when a circuit board component properly mounts to the pads 110-A, 110-B, the component orients substantially parallel to the common axis 116.

As show in FIG. 5, the pad 110-A is configured for mask-defined soldering. That is, metallic material of the pad 110-A actually has a rectangular shape, but the trapezoidal shape of the pad 110-A is defined by the shape of the mask 108 which overlies the pad 110-A. Accordingly, the solder joint which forms over the pad 110-A will also have a general trapezoidal shape since the solder will wet only to the exposed portions of metallic material.

In contrast, the pad 110-B is configured for copper-defined soldering. That is, the metallic material of the pad 110-B has a trapezoidal shape and the adjacent mask layer 108 simply mirrors the outer periphery of the pad 110-B to protect the circuit board 104 (e.g., to substantially cover the surface trace 114 and similar circuit board structures). Although the construction of the pads 110-A, 110-B is different (i.e., mask-defined versus copper-defined), the size and shape of the pads 110-A, 110-B is substantially the same. That is, the size and shape of the pads 110-A, 110-B mirror each other. In one arrangement, and by way of example only for a standard 0603 sized package, the pad inner widths 122-A, 122-B are substantially 40 mils (e.g., +/− a margin of error such as 5%), the first edge widths 120-A, 120-B are substantially 25 mils, and the second edge widths 122-A, 122-B are substantially 16 mils. Additionally, the lengths of the pads 110-A, 110-B are substantially 40 mils (e.g., 20 mils to from the side 112-A5 to the midpoint of the pad 110-A, and another 20 mils from the midpoint to the opposite side 112-A2 of the pad 110-A).

As further shown in FIG. 5, each pad 110-A, 110-B has a variety of dimensions as measured perpendicularly from the common axis 116. In particular, each pad 110-A, 110-B has an inner width 118-A, 118-B (collectively, inner widths 118), a first edge width 120-A, 120-B (collectively, first edges 120), and a second edge width 122-A, 122-B (collectively, second edges 122). The inner widths 118-A, 118-B are measured through central regions 124-A, 124-B of the pads 110-A, 110-B. In contrast, the first edge widths 120-A, 120-B are measured along the peripheral sides 112 of the pads 110-A, 110-B which are closest to each other, i.e., the first edge widths 120-A, 120-B run through the sides 112-A2, 112-B2 (see FIG. 5). Furthermore, the second edge widths 122-A, 122-B are measured along the peripheral sides 112 of the pads 110-A, 110-B which are furthest from each other, i.e., the second edge widths 122-A, 122-B run along the peripheral sides 112-A5, 112-B5 (FIG. 5).

As mentioned above in connection with the pads 32 of FIG. 1, each intersection 126 between two straight sides 112 is at an angle which is greater than 90 degrees. As a result, there are no sharp corners on the pads 110 which could create outer-reaching spaces that could draw a component terminal into an improper orientation during the soldering process. Accordingly, when solder wets to the pads 110, the solder tends to draw component contacts toward the central regions 124-A, 124-B of the pads 110.

Additionally, it should be understood that the intersections 126 of the sides 112 tend to be rounded due to the increase in exposed surface area, relative to a straight edge, during the etching process. The wide angles between intersecting sides 112 and rounded corners 126 promotes good solder distribution over the pad surfaces, i.e., distribution of a proper and even amount of solder over the pad surfaces. Furthermore, the stencils which are used to spread the solder paste can have apertures which match the geometry of the pads 110. Since the angles of the intersecting sides 112 are greater than 90 degrees and rounded to match the pads 110, the angles within the apertures of the stencil are also greater than 90 degrees thus facilitating solder paste removal from the apertures and reducing the likelihood of aperture clogging (i.e., preventing old solder paste from clogging the apertures).

In one arrangement, the pads 110 are significantly smaller than conventional rectangle-shaped SMT pads. For example, a conventional rectangle-shaped SMT pad for a standard 0603 package is typically around 60 mils length. In contrast to such conventional SMT pads and in accordance with an arrangement of the invention, the pad inner widths 118 are substantially 40 mils (e.g., +/− a margin of error such as 5%), the pad first edge widths 120 are substantially 25 mils, and the pad second edge widths are substantially 16 mils. As a result, the pads 122 do not have significant outer-reaching peripheral spaces (e.g., outer-reaching side spaces and corner spaces) and less solder can be used than in conventional approaches thus reducing the possibilities of crowning, flooding (i.e., burying the component contact) or floating. Additionally, the absence of such outer-reaching peripheral spaces reduces the space in which the component is free to move in response to drawing forces (e.g., solder surface tension), and the component terminals are drawn toward central regions 124-A, 124-B of the pads 110-A, 110-B. Furthermore, the drawing forces tend to be smaller and more focused about the central regions 124-A, 124-B compared to the drawing forces of conventional larger-sized SMT pads. Thus, with the invention, it is unlikely that the component terminals will be drawn into an improper orientation (e.g., unlikely drawn to a pad periphery space and out of alignment with the common axis 116, unlikely drawn into a tombstoning position, etc.).

It should be understood that, in one arrangement, the surface trace 114 which connects to the pad 110-B is permitted to intersect the pad 114 only along particular ranges of the three sides 112-B4, 112-B5 and 112-B6 which are distal from the other pad 110-A. In this arrangement, the circuit board manufacturer imposes a "keep-out" restriction by preventing any surface traces from intersecting the three sides 112-B1, 112-B2 and 112-B3 which are proximate the pad 110-A. That is, the manufacturer defines a keep-out region 128 adjacent the three sides 112-B1, 112-B2 and 112-B3. Accordingly, the are no significant differences in exposed metallic surface area between the two pads 110-A, 110-B, and the affect of the surface trace 114 (e.g., in drawing the component into an improper orientation) is minimal.

In one arrangement, the circuit board manufacturer further imposes a requirement that the intersecting surface 114 trace must intersect at a substantially orthogonal angle to the pad 110-B. Accordingly, there is minimal exposed surface trace material. Furthermore, there is a reduced likelihood of trapping contaminants on the surface of the circuit board (e.g., acid and cleaning solvents from the etching processes, solder, etc.) which could later threaten the reliability of the circuit board assembly. The manufacturer then can easily guide the surface trace 114 in a different direction after a predefined length of that trace 114 passes underneath the mask layer 108. The above-provided explanation of suitable surface trace placements for the surface trace 114 leading to the pad 110-B similarly applies to surface traces that connect to the pads 32 (see FIG. 1).

It should be further understood that the mask-defined soldering pad 110-A and the copper-defined soldering pad 110-B are easily visually distinguishable from each other. That is, the geometrical differences between the pads 110-A, 110-B essentially serve as structural (or non-printed) polarity indicators for mounting components in which orientation is significant. Accordingly, the combination of the two pads 110-A, 110-B is well-suited for situations in which a component requires proper orientation. This aspect will now be further explained with reference to an example.

Suppose that the manufacturer wishes to manufacture circuit boards having surface mounted diodes. The manufacture can easily impose a standard, or rule, in which each circuit board mounting location for such a diode includes the pads 110-A, 110-B with the mask-defined pad 110-A configured to solder to one of the anode and the cathode of the diode, and the copper-defined pad 110-B configured to solder to the other of the anode and the cathode. For example, suppose that the manufacture requires each anode to solder to a mask-defined pad 110-A, and each cathode to solder to a copper-defined pad 110-B. As a result, during the circuit board design phase, the manufacturer will purposefully run each signal trace for a diode anode through a plated-through hole 116 and a rectangle-shaped pad 110-A with a trapezoid-shaped mask opening. Additionally, the manufacturer will purposefully run each signal trace for a diode cathode through a surface trace 114 and a trapezoid-shaped pad 110-B. Then, during the component soldering phase, the manufacturer will know to solder diode components such that the anodes mount to the rectangle-shaped pads 110-A with trapezoid-shaped mask openings, and such that the cathodes mount to the trapezoid-shaped pads 110-B.

It should be understood that the pads 110-A, 110-B are already easily visually distinguishable based on pad geometry (e.g., the conductive material of the mask-defined pad 110-A is rectangle-shaped and viewable through the transparent mask layer 108, and the far side 112-A5 of the pad 110-A is immediately adjacent the plated-through hole 116). Accordingly, the manufacturer does not need to mark the pads 110-A, 110-B with ink to help distinguish the pads 110-A, 110-B from each other. Rather, when the manufacturer places a circuit board component having orientation dependences (e.g., a diode) over the mounting location 102 of FIG. 5 and in contact with printed solder paste (see step 94 in FIG. 4), the manufacturer simply visually distinguishes the pad 110-A from the pad 110-B based on pad geometry (i.e., visual polarity indicators), and places an anode over one of the pads 110-A, 110-B and a cathode over the other of the pads 110-A, 110-B. Since these aspects of the circuit board 104 are permanent critical features, there is little or no opportunity for the manufacturer to have difficultly identifying the pads 110 for the anodes and the pads for the cathodes (e.g., there is no printed polarity ink markings that could print unclearly or rub off, etc. as in conventional approaches to labeling anode and cathode pads). Further details of the invention will now be provided with reference to FIG. 6.

Figure 6:
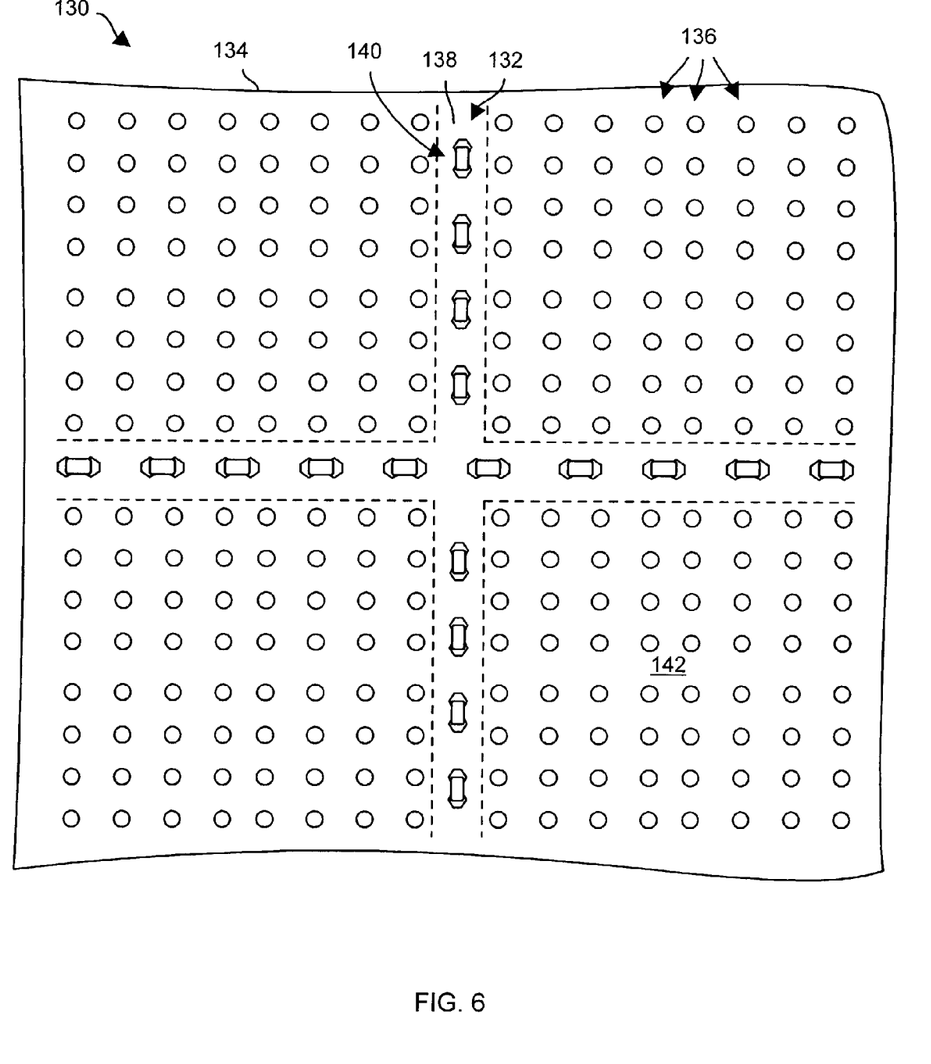
FIG. 6 is a top view of multiple sets of pads on a circuit board which is suitable for use by the invention.

FIG. 6 is a top view 130 of multiple sets of pads 132 (e.g., 18 sets) on a portion of a circuit board 134 which is suitable for use by the invention. By way of example only, the pad sets 132 reside within an array of vias 136 (e.g., a 16×16 array of vias). Such an array 134 is well-suited for connecting to an array of SMT pads that solders to a circuit board component having a corresponding high density (or pitch) array of contacts (e.g., a BGA component).

For example, suppose that a circuit board manufacturer wishes to mount a BGA component to an array of SMT pads on a circuit board. In accordance with some arrangements of the invention, the circuit board manufacturer lays out the array of pads on one side of the circuit board. The manufacturer then layouts the vias to the array of pads. In particular, the manufacturer purposefully orients the vias to particular sides or corners of the pads to form open spaces on the other side of the circuit board. These open spaces form a cross-bar 138 which is suitable for locating small packaged components such as ceramic resistors and diodes. By way of example and as shown in FIG. 6, the manufacture has positioned the pad sets 132 within a cross-bar 138 formed within the array of vias 136. The utilization of the circuit board space within the cross-bar 138 in this manner conserves circuit board space, i.e., does not interfere with other space so that the other space can be configured to accommodate other circuit board features (e.g., other components, surface traces, etc.).

To form a circuit board assembly having the arrangement of pads 132 and components 140 of FIG. 6, the manufacturer first places the circuit board 104 so that the pads 132 face up and prints solder paste (e.g., using a stencil having paste apertures that match the pad dimensions) over the pads 132 (step 92 in FIG. 4). The manufacturer then places the components 140 in contact with the printed solder paste (step 94 in FIG. 4). The manufacturer then applies heat (e.g., passes the circuit board 104 through an oven) which activates flux within the solder paste and melts solder in the solder paste to form solder joints (step 96 in FIG. 4). After the circuit board 104 has cooled so that solder joints form (e.g., see FIG. 3), the manufacturer (i) turns the circuit board over so that the pads 132 face down, (ii) prints solder paste on the opposite side of the circuit board 104 and places additional components (e.g., larger package components) in contact with the newly printed solder paste. Then, the manufacturer applies heat again (e.g., passes the circuit board through the over again) to solder the newly added components to the circuit board 104. During this second heat application phase, the solder joints for the components 140 and pads 132 re-flow. However, surface tension of the re-melted solder holds the components 140 to the pads 132. Furthermore, the central drawing action provided by the geometries of the pads 132 centers the component terminals within the pads 132 rather than allows the terminals to be drawn into improper orientations. Accordingly, when the circuit board finally cools off, the components 140 are still robustly and reliably soldered to the pads 132 (step 96). Either the pads 32 of FIG. 1 or the pads 110 of FIG. 5 are suitable for use as the pads 132 of FIG. 6.

Furthermore, it should be understood that the pads 132 are well-suited for use in locations other than within a cross-bar 138 of the array of vias 136. For example, the pads 132 can be placed on the opposite side of a component mounting location for a large component package such as a BGA component, i.e., on the side of the circuit board opposite the circuit board BGA pads. For illustration purposes only, the vias immediately adjacent the location 142 could be removed so that the BGA pads on the other side of the circuit board do not have any external connections (i.e., there are no etches or stringers leading to the BGA pads and no vias 136 connecting to the BGA pads. In such an arrangement, there is available space on the opposite side of the circuit board within the array of vias 136 to position one or more sets of pads 132 for mounting small components.

As described above, embodiments of the invention are directed to techniques for mounting a circuit board component to a circuit board 24, 104 using generally trapezoid-shaped pads 32, 110. The use of such pads 32, 110 (i) enables reliable mounting of circuit board components using a conventional soldering process such as printed paste soldering, as well as (ii) inhibits improper movement of the circuit board component if solder joints holding the component to the pads 32, 110 re-flow. Accordingly, the use of such techniques are well-suited for circuit board manufacturing processes which involve multiple heating phases (e.g., multiple passes through an oven resulting in melting of earlier-formed solder joints). Additionally, the use of such pads 32, 110 alleviates the need for alternative soldering solutions such as the use of high-temperature solder in an initial higher-temperature soldering process which could damage components due to higher temperature stresses. The techniques of the invention tend to raise circuit board manufacturing yields (e.g., more manufactured circuit boards without failure) as well as tend to lower manufacturing costs (e.g., less waste and less required rework).

While this invention has been particularly shown and described with references to preferred embodiments thereof, it will be understood by those skilled in the art that various changes in form and details may be made therein without departing from the spirit and scope of the invention as defined by the appended claims.

For example, the mounting locations 22, 102 were described above as including two SMT pads 32, 110 by way of example only. The mounting locations 22, 102 are well-suited for mounting components with other numbers of contacts as well. In some arrangements, the mounting locations 22, 102 include more than two SMT pads 32, 110 (e.g., four pads, six pads, etc.).

Additionally, it should be understood that the particular pad dimensions for mounting to standard 0603 sized components were provided above by way of example only. Other arrangements have other pad dimensions for the standard 0603 sized components. Furthermore, it should be understood that such dimensions are easily scalable to larger sized pads to accommodate larger packages (e.g., standard 0805 and 1206 packages), and to smaller sized pads to accommodate smaller packages.

Furthermore, it should be understood that the mounting location 22 of FIG. 1 shows two pads 32 which are well-suited for copper-defined soldering by way of example only. Similarly, the mounting location 102 of FIG. 5 shows two pads 102, one of which is well-suited for copper-defined soldering (i.e., the pad 110-B) and the other of which is well-suited for mask-defined soldering (i.e., the pad 110-A) by way of example only. Other combinations are acceptable as well. For instance, in another arrangement, the mounting location includes two pads which are configured for mask-defined soldering. In other arrangements, mounting locations include more than two pads and a variety of combinations of pads which are configured for copper-defined and mask-defined soldering.

Additionally, it should be understood that the pads 32 can be further equipped with a set of metallic tie-ins (or ears). Such features are essentially metallic traces that lead to the outer sides (e.g., see the sides 34-A4, 34-A5 and 34-A6 of the pad 32-A) of each pad 32. Accordingly, each pad 32 has substantially the same amount of exposed metallic material to provide balanced (or equalized) drawing forces on component during the soldering process. One or more ends of the tie-ins, which are covered by the mask layer 28 can be connected to one or more surface traces leading to other circuit board circuitry.

Furthermore, it should be understood that the above-provided component 52 was described as a diode circuit by way of example only. It should be understood that other types of circuits can be provided within the components as well such as resistors, capacitors, etc.

What is claimed is:

1. A circuit board, comprising:
   a layer of non-conductive material; and
   a set of soldering pads disposed on the layer of non-conductive material; wherein the set of soldering pads defines a common axis that extends substantially through a midline of each soldering pad; wherein each soldering pad has, as measured perpendicularly through the common axis, an inner width, a first edge width and a second edge width; wherein the inner width is longer than each of the first and second edge widths; and wherein the first edge width is longer than the second edge width;
   wherein each soldering pad defines a first edge and a second edge;
   wherein the set of soldering pads is configured to solder to a pair of terminals of a discrete circuit board component;
   wherein the first edge of each soldering pad has the first edge width and is configured to be covered by the discrete circuit board component when the pair of terminals of the discrete circuit board component is soldered to the set of soldering pads;
   wherein the second edge of each soldering pad has the second edge width and is configured to not be covered by the discrete circuit board component when the pair of terminals of the discrete circuit board component is soldered to the set of soldering pads; and
   wherein the common axis extends substantially through a midline of the first edge and a midline of the second edge of each soldering pad.

2. The circuit board of claim 1 wherein the set of soldering pads includes a pair of surface mount pads; wherein edges of the pair of surface mount pads, which are closest to each other, have the first edge width; and wherein edges of the pair of surface mount pads, which are furthest from each other, have the second edge width.

3. The circuit board of claim 1 wherein each soldering pad substantially defines a two-dimensional shape having six sides; and wherein each intersection between two of the sides has an angle which is greater than 90 degrees.

4. The circuit board of claim 1 wherein the set of soldering pads includes a surface mount pad which is configured for copper defined soldering, and wherein the circuit board further comprises:
   a surface trace, disposed on the layer of non-conductive material, that connects to the surface mount pad.

5. The circuit board of claim 1 wherein the set of soldering pads includes a surface mount pad which is configured for copper-defined soldering and a second soldering pad; wherein the surface mount pad has three sides which are distal from the second soldering pad and three other sides which are proximate the second soldering pad; wherein the surface trace physically connects to one of the three sides which are distal from the second soldering pad at a substantially orthogonal angle; and wherein the circuit board further includes a keep-out region adjacent the other three sides which are proximate the second soldering pad, the keep-out region being free off any surface trace.

6. The circuit board of claim 1 wherein the set of soldering pads includes a first surface mount pad which is configured for copper-defined soldering and a second surface mount pad which is configured for mask-defined soldering.

7. The circuit board of claim 6, further comprising:
   a plated-through hole which extends through the layer of non-conductive material and physically connects with the second surface mount pad which is configured for mask-defined soldering.

8. The circuit board of claim 6 wherein the set of soldering pads is configured to solder to a package containing a diode circuit, the first surface mount pad being configured to solder to one of an anode and a cathode of the diode circuit, the second surface mount pad being configured to solder to the other of the anode and the cathode of the diode circuit.

9. The circuit board of claim 6 wherein the second surface mount pad substantially defines a rectangular shape, and wherein a mask layer covers a periphery of the rectangular shape and defines an exposed inner region of the second surface mount pad as a two-dimensional shape which matches a two-dimensional shape defined by the first surface mount pad.

10. The circuit board of claim 1, further comprising:
    additional sets of soldering pads which are configured to solder to packages containing diode circuits; wherein each set of soldering pads, including the set of soldering pads and the additional sets of soldering pads, includes (i) a first surface mount pad which is configured for copper-defined soldering to an anode of a diode circuit contained in a package corresponding to that set of soldering pads, and (ii) a second surface mount pad which is configured for mask-defined soldering to a cathode of the diode circuit contained in the package corresponding to that set of soldering pads.

11. The circuit board of claim 1, further comprising:
    additional sets of soldering pads which are configured to solder to packages containing diode circuits; wherein each set of soldering pads, including the set of soldering pads and the additional sets of soldering pads, includes (i) a first surface mount pad which is configured for copper-defined soldering to a cathode of a diode circuit contained in a package corresponding to that set of soldering pads, and (ii) a second surface mount pad which is configured for mask-defined soldering to an anode of the diode circuit contained in the package corresponding to that set of soldering pads.

12. The circuit board of claim 2 wherein the common axis, which is defined by the set of soldering pads, passes through each of the edges which are closest to each other and the edges which are furthest from each other.

13. The circuit board of claim 1 wherein the common axis, which is defined by the set of soldering pads, passes through each of the inner width, the first edge width and the second edge width.

14. The circuit board of claim 13 wherein each soldering pad has a shape resulting from a combination of side-by-side trapezoids.

15. The circuit board of claim 13 wherein the common axis substantially bisects each of the first edge and the second edge.

16. The circuit board of claim 1 wherein each soldering pad defines a pad surface having a two dimensional shape with six edges and six corners; wherein an angle over the pad surface at each corner is greater than 90 degrees and less than 180 degrees; and wherein the two dimensional shape is formed by abutting largest sides of exactly two trapezoids together.

17. A circuit board, comprising:
a rigid structure having a first outer surface and a second outer surface;
an array of soldering pads disposed on the first outer surface, the array of soldering pads being configured to solder to a first circuit board component;
an array of plated-through holes which extend through the set of circuit board layers from the first outer surface to the second outer surface, the array of plated-through holes defining a cross-bar region on the second outer surface; and
a set of soldering pads disposed within the cross-bar region on the second outer surface; wherein the set of soldering pads is configured to solder to a second circuit board component; wherein the set of soldering pads defines a common axis that extends substantially through a midline of each soldering pad; wherein each soldering pad has, as measured perpendicularly through the common axis, an inner width, a first edge width and a second edge width; wherein the inner width is longer than each of the first and second edge widths; and wherein the first edge width is longer than the second edge width;
wherein each soldering pad of the set of soldering pads defines a first edge and a second edge;
wherein the set of soldering pads is configured to solder to a pair of terminals of the second circuit board component;
wherein the first edge of each soldering pad of the set of soldering pads has the first edge width and is configured to be covered by the second circuit board component when the pair of terminals of the second circuit board component is soldered to the set of soldering pads;
wherein the second edge of each soldering pad of the set of soldering pads has the second edge width and is configured to not be covered by the second circuit board component when the pair of terminals of the second circuit board component is soldered to the set of soldering pads; and
wherein the common axis extends substantially through a midline of the first edge and a midline of the second edge of each soldering pad of the set of soldering pads.

18. The circuit board of claim 17 wherein the common axis, which is defined by the set of soldering pads, passes through each of the inner width, the first edge width and the second edge width.

19. The circuit board of claim 18 wherein each soldering pad has a shape resulting from a combination of side-by-side trapezoids.

20. The circuit board of claim 17 wherein each soldering pad of the set of soldering pads defines a pad surface having a two dimensional shape with six edges and six corners; wherein an angle over the pad surface at each corner is greater than 90 degrees and less than 180 degrees; and wherein the two dimensional shape is formed by abutting largest sides of exactly two trapezoids together.

21. A circuit board, comprising:
support means for supporting soldering pads; and
a set of soldering pads disposed on the support means;
wherein the set of soldering pads defines a common axis that extends substantially through a midline of each soldering pad; wherein each soldering pad has, as measured perpendicularly through the common axis, an inner width, a first edge width and a second edge width; wherein the inner width is longer than each of the first and second edge widths; and wherein the first edge width is longer than the second edge width;
wherein each soldering pad defines a first edge and a second edge;
wherein the set of soldering pads is configured to solder to a pair of terminals of a discrete circuit board component;
wherein the first edge of each soldering pad has the first edge width and is configured to be covered by the discrete circuit board component when the pair of terminals of the discrete circuit board component is soldered to the set of soldering pads;
wherein the second edge of each soldering pad has the second edge width and is configured to not be covered by the discrete circuit board component when the pair of terminals of the discrete circuit board component is soldered to the set of soldering pads; and
wherein the common axis extends substantially through a midline of the first edge and a midline of the second edge of each soldering pad.

22. The circuit board of claim 21 wherein the set of soldering pads includes a pair of surface mount pads; wherein edges of the pair of surface mount pads, which are closest to each other, have the first edge width; wherein edges of the pair of surface mount pads, which are furthest from each other, have the second edge width; and wherein the common axis, which is defined by the set of soldering pads, passes through each of the edges which are closest to each other and the edges which are furthest from each other.

23. The circuit board of claim 22 wherein each soldering pad has a shape resulting from a combination of side-by-side trapezoids.

24. The circuit board of claim 21 wherein each soldering pad defines a pad surface having a two dimensional shape with six edges and six corners; wherein an angle over the pad surface at each corner is greater than 90 degrees and less than 180 degrees; and wherein the two dimensional shape is formed by abutting largest sides of exactly two trapezoids together.

25. A method for making a circuit board assembly having a circuit board, the method comprising the steps of:
printing solder paste onto a set of soldering pads of the circuit board;
wherein the set of soldering pads defines a common axis that extends substantially through a midline of each soldering pad;
wherein each soldering pad has, as measured perpendicularly through the common axis, an inner width, a first edge width and a second edge width;
wherein the inner width is longer than each of the first and second edge widths;
wherein the first edge width is longer than the second edge width;
wherein each soldering pad defines a first edge and a second edge;
wherein the set of soldering pads is configured to solder to a pair of terminals of a discrete circuit board component;
wherein the first edge of each soldering pad has the first edge width and is configured to be covered by the discrete circuit board component when the pair of terminals of the discrete circuit board component is soldered to the set of soldering pads;
wherein the second edge of each soldering pad has the second edge width and is configured to not be covered by the discrete circuit board component when the pair of terminals of the discrete circuit board component is soldered to the set of soldering pads; and wherein the common axis extends substantially through a midline of the first edge and a midline of the second edge of each soldering pad;

placing the discrete circuit board component in contact with the printed solder paste; and applying heat to melt solder within the printed solder paste to solder the discrete circuit board component to the set of soldering pads thus forming the circuit board assembly.

26. The method of claim 25, further comprising the steps of:

after the step of applying heat, printing additional solder paste on an array of soldering pads of the circuit board;

placing a second circuit board component in contact with the additional printed solder paste; and applying heat to melt solder within the additional printed solder paste to solder the second circuit board component to the array of soldering pads.

27. The method of claim 26 wherein the step of applying heat to melt the soldering within the additional printed solder paste includes the step of:

providing heat such that solder attached to the set of soldering pads re-flows.

28. The method of claim 25 wherein the set of soldering pads includes a first surface mount pad which is configured for copper-defined soldering and a second surface mount pad which is configured for mask-defined soldering, wherein the circuit board component includes a diode circuit, and wherein the step of placing includes the step of:

visually distinguishing the first surface mount pad from the second surface mount pad based on pad geometry; and placing an anode of the pair of terminals over one of the first and second mount pads and a cathode of the pair of terminals over the other of the first and second mount pads in response to the step of visually distinguishing.

29. The method of claim 28 wherein a plated-through hole physically connects with the second surface mount pad which is configured for mask-defined soldering, and wherein the step of visually distinguishing includes the step of:

identifying the second surface mount pad based on the plated-through hole physically connected with the second surface mount pad.

* * * * *